United States Patent [19]

Frohlich et al.

[11] Patent Number: 4,596,624
[45] Date of Patent: Jun. 24, 1986

[54] APPARATUS FOR LAMINATING MULTILAYERED PRINTED CIRCUIT BOARDS

[75] Inventors: Sigurd Frohlich, Santa Barbara; James V. Morris, El Toro, both of Calif.

[73] Assignee: Cirtel, Inc., Irvine, Calif.

[21] Appl. No.: 606,214

[22] Filed: May 2, 1984

[51] Int. Cl.⁴ .............................................. B32B 31/00
[52] U.S. Cl. .................................... 156/382; 156/497; 156/285
[58] Field of Search ............... 156/381, 382, 383, 285, 156/286, 497; 422/242, 295, 296; 264/102; 220/401, 405, 406, 420, 20, 221; 228/903; 108/106, 107, 144, 149, 148; 211/103, 117, 207

[56] References Cited

U.S. PATENT DOCUMENTS

| | | | |
|---|---|---|---|
| 1,590,296 | 6/1926 | Klein et al. | 108/106 |
| 2,952,145 | 9/1960 | Thompson | 108/144 |
| 4,127,436 | 11/1978 | Friel | 156/285 X |
| 4,234,373 | 11/1980 | Reavill et al. | 156/382 |
| 4,407,685 | 10/1983 | Hankland | 156/285 X |
| 4,431,471 | 2/1984 | Mertens et al. | 156/382 X |

Primary Examiner—Edward Kimlin
Assistant Examiner—Ramon R. Hoch
Attorney, Agent, or Firm—Leonard Tachner

[57] ABSTRACT

An apparatus for laminating multilayered printed circuit boards while radically reducing the volume of inert gas that must otherwise be used to effect the lamination process. The invention employs a novel ring assembly, each such assembly disposed on a moveable, horizontally disposed shelf. Each such ring assembly comprises a hollow circular cylinder, the interior of which is adapted to radially enclose a multiple layer circuit module mounted on a heating platen. The axial surfaces of the cylinder are capped by a pair of seal plates and O-rings to form a gas-tight laminating chamber. Each shelf is adapted to travel vertically along a pair of support tubes whereby the entire array of shelves may be compressed relative to the respective shelves by a hydraulic or pneumatic cylinder the rod of which is affixed to the bottom surface of the lowermost shelf.

14 Claims, 9 Drawing Figures

APPARATUS FOR LAMINATING MULTILAYERED PRINTED CIRCUIT BOARDS

BACKGROUND OF THE INVENTION

1. Field of the Invention

The present invention relates to an apparatus for laminating multilayered printed circuit boards and more particularly, to the use of a high pressure sealing ring into which a heated gas may be introduced for laminating multilayered printed circuit boards.

2. Prior Art

Multilayered printed circuit boards comprise a number of circuit layers separated by insulation layers which are laminated together to form a solid board. Each circuit layer consists of an insulation layer on which copper circuit traces appear on one or both sides thereof. The insulation layer is, typically, a thin sheet of fiberglass or film dielectric and such insulating sheets are placed between the circuit layers.

In the past, such multilayered printed circuit boards have been laminated together by being placed between a pair of steel plates within a hydraulic press. The press is heated to a predetermined temperature and a pressure is applied for a predetermined time. The multilayered assembly may be placed within an air tight, sealed chamber which is connected to a vacuum pump whereby air bubbles and gases produced during the heating of the material may be removed.

This prior art method has become unsatisfactory for at least two reasons. In the past, multilayered printed circuit boards have either been rigid or flexible. In a rigid circuit board, each circuit layer consists of an insulation layer made from a rigid material. In a flexible circuit board, each circuit layer consists of an insulation layer made from a flexible sheet of material. However, modern multilayered printed circuit boards have both rigid and flexible portions. The lamination of such boards presents a number of difficult technical problems relating to thermal expansion and the even application of pressure during the lamination process. The portions of the multilayered circuit board which are rigid have coefficients of thermal expansion that are different than the portions which are flexible. Furthermore, the portions which are flexible are typically much thinner than the rigid portions so that elaborate inserts must be developed so that the press applies a uniform pressure to the entire circuit board during the lamination process.

Another problem relates to the spacing between the copper circuit traces on the individual circuit layers. Modernly, the circuit traces have become finer and more closely spaced and it is necessary that the insulation material flow uniformly into the spaces between all circuit traces during the lamination process. In this manner, the insulating layer functions not only to insulate the circuit traces on one layer of a multilayered board from the facing traces on an adjacent layer, but also serves to insulate the individual traces on each multilayered board from each other. The steel plates of conventional hydraulic presses, being rigid, will not conform to irregularities in the multilayers and are simply not capable of applying a uniform pressure which will cause the insulation material to flow uniformly into all of the spaces between the circuitry. Therefore, air becomes trapped within the layers. This air creates spaces between circuit tracers which are not filled with insulation material, resulting in possible shorts and rendering the multilayered printed circuit board subject to possible failure during operation.

One plausible solution to the aforementioned problems of the prior art has been provided by a invention of the applicant of the present application in an application entitled METHOD AND APPARATUS FOR LAMINATING MULTILAYERED PRINTED CIRCUIT BOARDS HAVING BOTH RIGID AND FLEXIBLE PORTIONS filed on Mar. 9, 1984 under Ser. No. 587,928. This prior patent application of the present applicant is incorporated herein by reference. In that prior application a pressure vessel is disclosed for laminating the multiple layers of a multilayered printed circuit board by employing heating and cooling elements within the vessel. The multilayered circuits are placed on a steel plate which rests on a bleeder plate which, in turn, rests on a vacuum plate. The circuit layers are covered with another steel plate, a sheet of silicone material, a breather blanket and a plastic vacuum bag which is hermetically sealed to the plate using a silicone sealing material. The vacuum line is connected from the vacuum plate out of the vessel to a vacuum pump. The printed circuit boards and the enclosure are placed in the pressure vessel and the vessel is sealed. An inert gas, such as nitrogen or carbon dioxide is introduced into the pressure vessel to achieve the desired pressure. Then the vessel is heated to a suitable lamination temperature. While the materials are being heated, any gases given off are removed by the vacuum pump. After outgassing is completed and the temperature in the pressure vessel is raised to the required level, the induced high pressure is maintained for a predetermined period of time after which the heating element is deactivated and the cooling is activated to cool down the multilayered circuit board while the pressure is maintained. The pressure is then released and the gas expelled from the pressure vessel which may then be opened to remove the parts.

Although the aforementioned prior patent application of the present applicant discloses a novel and substantially advantageous advance over the prior art for laminating the various layers of a multilayered printed circuit board, it has been found that in typical applications, up to 5,000 gallons of inert gas such as carbon dioxide is necessary to accomplish the lamination process. This volume of gas is itself a disadvantageous expense. Furthermore, the requirement for filling a pressure vessel and then evacuating a pressure vessel with 5,000 gallons of carbon dioxide or other inert gas is a time consuming process and therefore an additional costly feature of the prior invention. Finally, the process of heating up to 5,000 gallons of an inert gas to the requisite temperature for the lamination process can be quite costly from the standpoint of energy utilization and therefore also adds significantly to the overall expense of utilizing the applicants' previously disclosed process and apparatus.

As noted in the prior aforementioned application of the present applicant, it is known in the prior art to use air pressure to laminate two parts together. The two parts to be laminated together are typically placed in a vacuum bag within a vessel into which air pressure is introduced. The air within the vessel is heated to a predetermined temperature and pressure is applied for a predetermined time. However, while lamination of two parts using air pressure has been known, it has never been thought possible heretofore that such a technique could be used to perform the intricate lamination required when laminating a large number of complex layers of a multilayered printed circuit board.

SUMMARY OF THE PRESENT INVENTION

The present invention overcomes the aforementioned disadvantages of the prior art as well as the noted cost disadvantages of the applicants' previously disclosed invention by providing a selectively sealable laminating system which combines a hydraulic or pneumatic cylinder and a plurality of unique ring assemblies. Each such ring provides a selectively sealable local chamber for each multilayered laminate which permits the application of a high temperature inert gas as well as the application of a vacuum. This novel improvement permits carrying out the method of the previously noted invention, but with only approximately 1/10th of 1% of the volume of inert gas previously required. In a disclosed embodiment of the invention, a plurality of vertically spaced horizontal shelves are each connected to a pair of elongated tubular columns by a corresponding pair of Thompson bearings which permit vertical motion of the shelves along the columns. The lowermost shelf is secured to the movable rod of the hydraulic or pneumatic cylinder. Each such shelf is designed to support a heating platten upon which the multilayered laminate structure to be processed by the present invention is mounted. The unique ring assembly encloses the heating platten and the multilayered structure to be laminated. Each such ring assembly comprises a hollow circular cylindrical member which is capped top and bottom by a pair of sealing plates.

The interfacing surfaces of the circular cylindrical member and the sealing plates provide matching and opposing annular slots to receive a pair of O-rings and thus provide a gas-tight seal within a chamber formed by the interior portion of the cylinder and the two sealing plates. This chamber contains the laminate structure during the laminating process as will be hereinafter more fully understood. The first or lowermost shelf of the present invention is secured directly to the extendable rod of the hydraulic or pneumatic cylinder. One of the aforementioned sealing plates is then secured to the top surface of the first such shelf. This sealing plate is adapted to act as the bottom sealing surface of the lowermost ring assembly, the sealing being provided by the aforementioned annular slots and corresponding O-rings. The opposing sealing plate for the ring assembly may be secured to the opposing axial surface of the cylinder or alternatively, to the bottom surface of the next vertically spaced laminating shelf. Thus, when the cylinder is extended, the spacing between the two shelves is decreased until the respective sealing plates come into sealing contact with the cylinder thereby enclosing the laminate structure mounted on the first shelf within a gas-tight environment comprising the two sealing plates and the cylinder of the corresponding ring assembly.

The top surface of the second shelf, which is suspending above the first shelf, receives an additional sealing plate and the cylinder of an additional ring assembly which is identical in configuration to the ring assembly described with respect to the first shelf. A second sealing plate for the second ring assembly caps the cylinder or may be secured to the lower surface of a third shelf that is suspended above and spaced from the second shelf as previously described. This assembly of vertically spaced shelves may be selectively compressed by extending the rod of the pneumatic or hydraulic cylinder to which the lowermost shelf is connected. When extended, the cylinder rod typically creates a sealing pressure of approximately 100 pounds per square inch which compresses each pair of sealing plates in sealing engagement with their respective sandwiched ring assembly and thereby seals each laminate for application of high pressure heated inert gas within a relatively small volume.

Accordingly, the lamination process takes place with a greatly diminished volume of inert gas as compared to the applicants' prior invention as hereinabove described. Furthermore, it will be seen hereinafter that the invention also employs a silicon foil or skin within each chamber formed by the respective ring assemblies, in order to provide concurrent means for drawing a vacuum in the immediate environment surrounding the laminate to remove outgassing of the lamination process and to remove any air or other gas buffer that might otherwise interfere with the lamination process.

OBJECTS OF THE INVENTION

It is therefore a principal object of the present invention to provide an apparatus for laminating multilayered printed circuit boards, which apparatus is especially suitable for laminating circuit boards having both rigid and flexible portions, but without incurring the prior art requirement for using extremely large volumes of inert gas for the lamination process thereby substantially reducing the costs of laminating multilayered printed circuit boards.

It is an additional object of the present invention to provide an improved apparatus for laminating multilayered printed circuit boards utilizing a heated inert gas supplied under pressure to the layers to be laminated and to which a vacuum may be applied for removing outgassing during the lamination process and wherein a plurality of such multilayered printed circuit board laminations may be accomplished simultaneously with each such laminate being subjected to localized inert gas pressure independent of the other such laminates.

It is still a further object of the present invention to provide a gas pressure laminating system for multilayered printed circuit boards, the system comprising a selectively compressible multi-shelf system having a plurality of ring assemblies, each such ring assembly being adapted for sealing a multilayered printed circuit board laminated structure therein for applying heated inert gas under pressure.

It is still a further object of the present invention to provide an improved apparatus for laminating multilayered printed circuit boards having a plural shelf configuration, each such shelf being adapted to support a heating element and a sealing structure which permits the application of heated inert gas to the circuit boards to achieve said lamination and wherein the respective shelves of said system are selectively compressed relative to one another to provide said seal, and are alternatively spread apart relative to one another to provide access to the laminate.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the accompanying drawings in which.

DETAILED DESCRIPTION OF A PREFERRED EMBODIMENT

Figure 1:
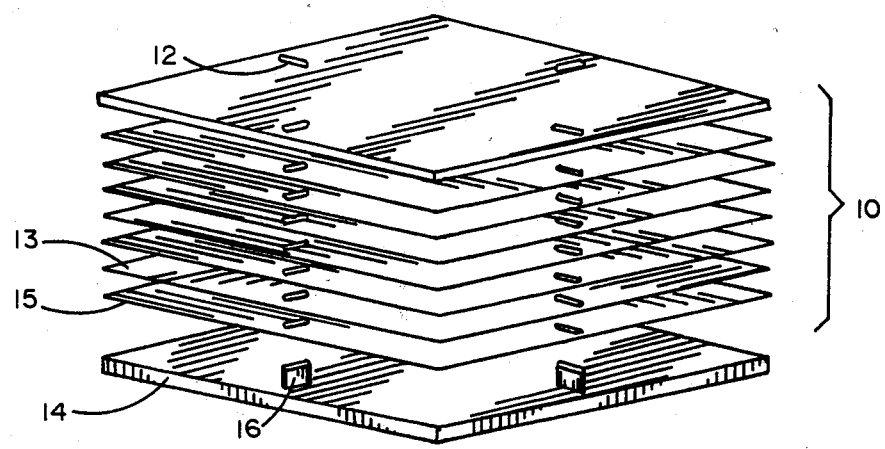
FIG. 1 is an exploded perspective view of a completely assembled multilayered module ready to be inserted into the present invention for lamination.
Figure 2:
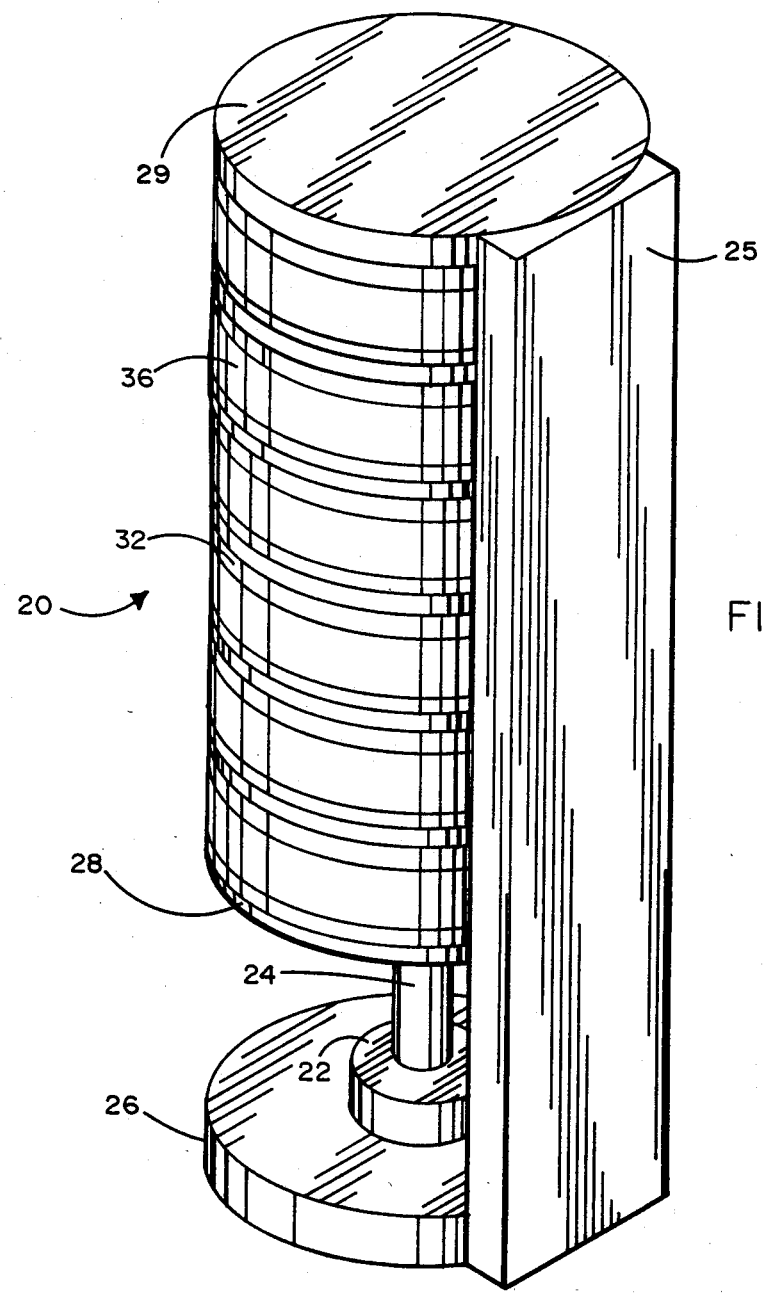
FIG. 2 is a three-dimensional illustration of one embodiment of the invention.
Figure 3:
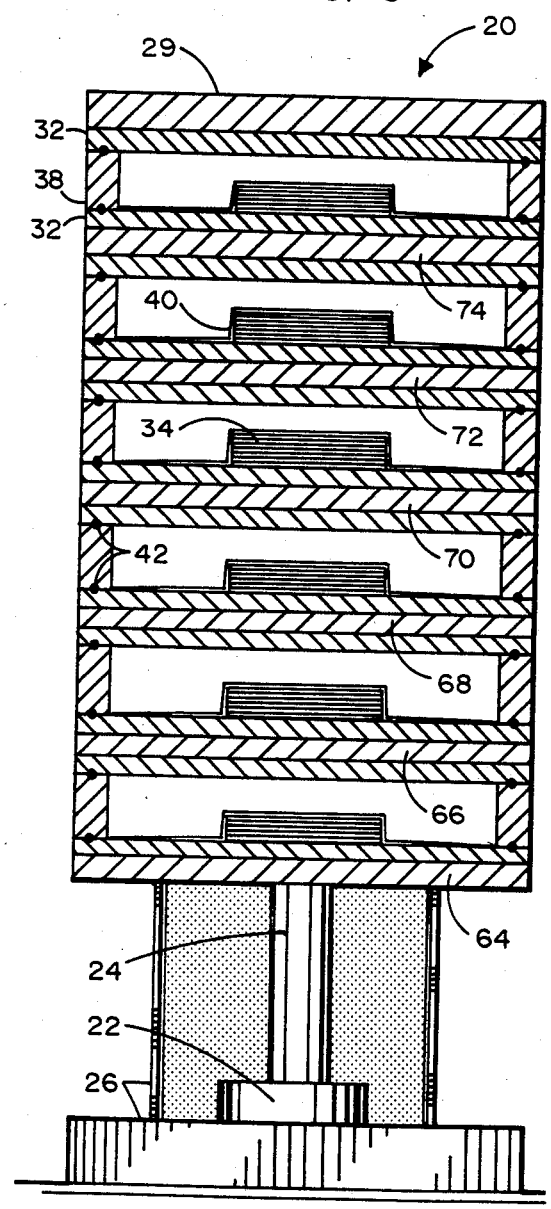
FIG. 3 is a cross-sectional front view of an illustrative embodiment of the present invention during lamination.
Figure 4:
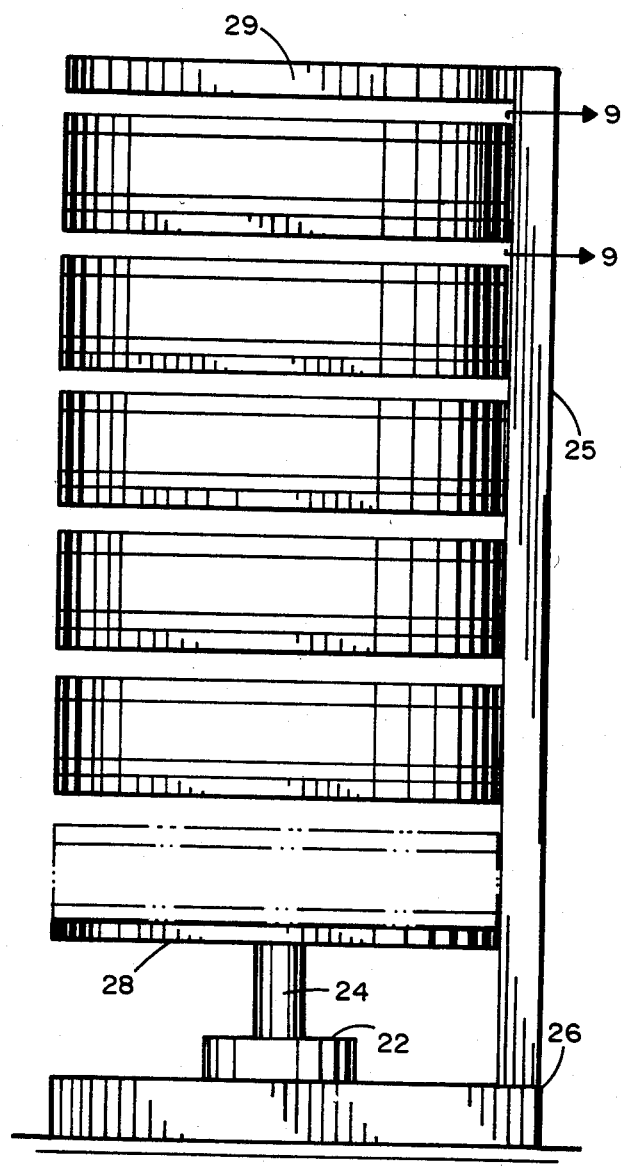
FIG. 4 is a side view of the embodiment of the present invention illustrated in FIG. 2, but prior to or subsequent to lamination.
Figure 5:
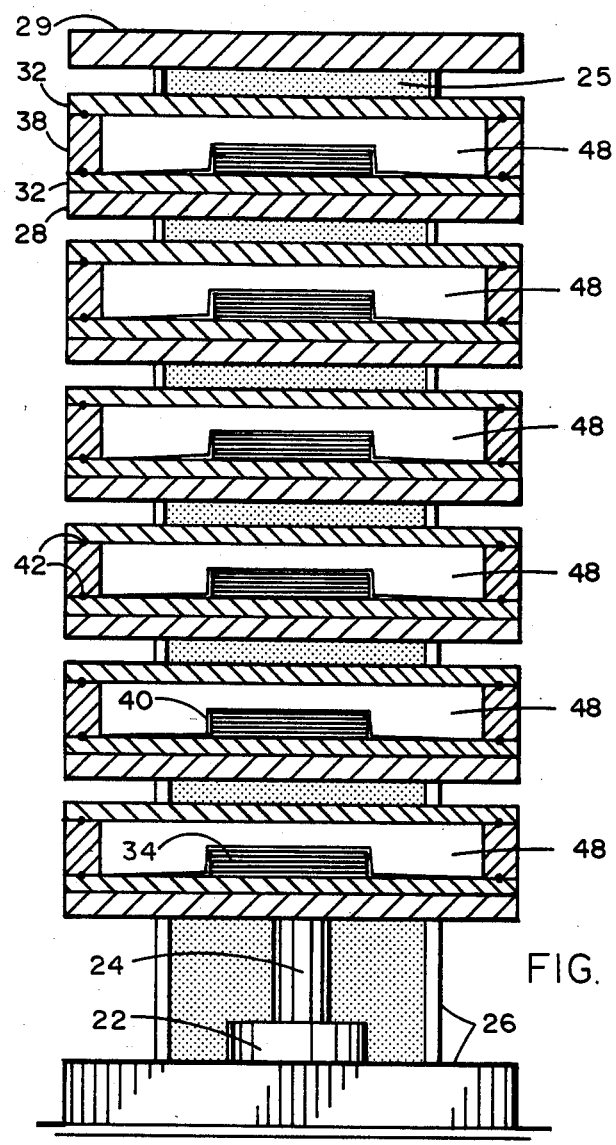
FIG. 5 is a cross sectional front view of the invention in the same operational mode as illustrated in FIG. 4.

Referring first to FIG. 1, there is shown therein the various layers of a multilayered printed circuit board in a registered vertically layered configuration in preparation for lamination by the laminating system of the present invention. The multilayered circuit board 10 of FIG. 1 comprises a plurality of individual layers of alternating insulation layers 13 and circuit layers 15. Each of these layers comprises a plurality of registration holes 12 which are adapted to align with one another on the respective layers and with a corresponding plurality of registration posts 16 which extend from a registration plate 14 shown at the bottom of FIG. 1. In the particular embodiment of a multilayered circuit board shown in FIG. 1, registration plate 14 serves the principal purpose of aligning the various circuit layers and insulation layers to be laminated in the present invention. In the disclosed embodiment of the invention, the multilayered circuit board to be laminated rests on a heating platten during the lamination process. It will be understood that the heating platten may be separate or may be incorporated into registration plate 14 which would then serve the dual function of aligning the various layers to be laminated while also supplying the necessary lamination contact temperature, typically approximately 400 degrees F.

Figure 6:
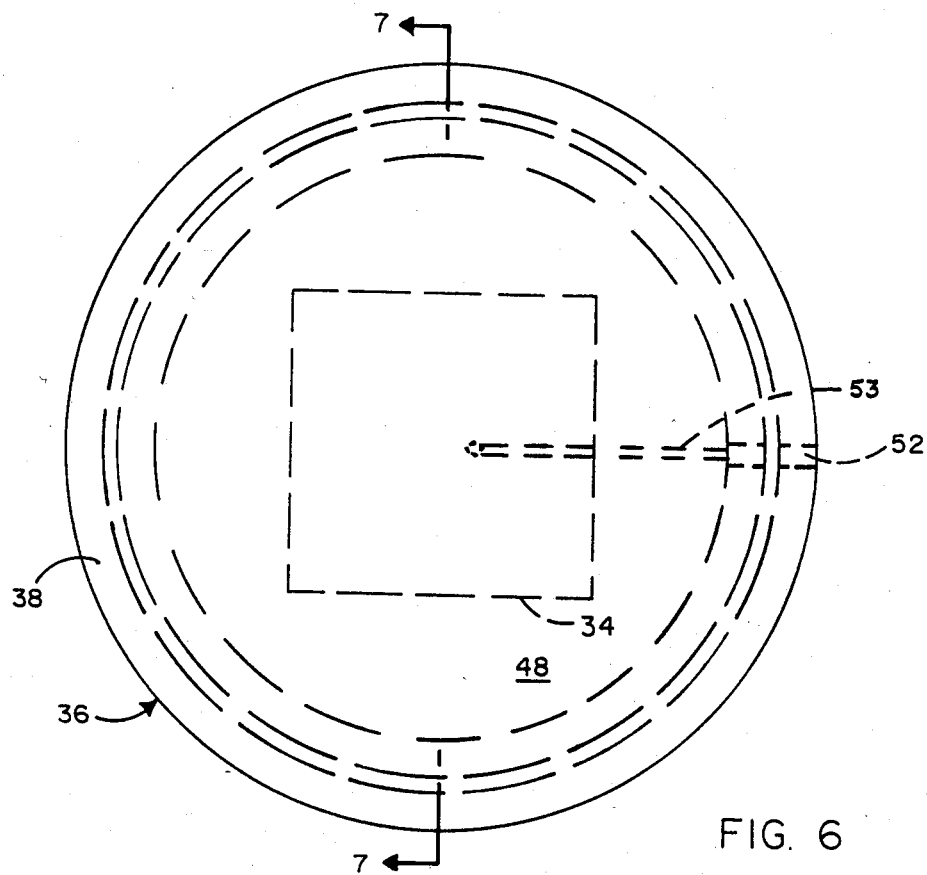
FIG. 6 is an enlarged top view of a ring assembly of the present invention.

The laminating system of the present system is shown in FIGS. 2 through 5 which shall now be discussed. As seen in FIGS. 2 through 5, the laminating system 20 comprises a pneumatic or hydraulic cylinder 22 having an extendable rod 24. The uppermost end of the rod 24 is connected to a first of a plurality of vertically stacked horizontal shelves 28 which are aligned within a housing 26. Housing 26 terminates in a hood 29 that is spaced from the cylinder 22 by a fixed distance that is sufficient to accommodate a given plurality of shelves 28. Each of the shelves 28 is connected to a lift assembly 25 the details of which will be discussed hereinafter more fully in conjunction with FIGS. 6 and 7. However, for the purposes of the present discussion, it should be noted that the shelves 28 are designed to travel vertically within housing 26 in response to the extension of the rod 24 of the cylinder 22. The shelves travel in response to the force transmitted sequentially from the rod acting through the first shelf 64 which, as will be seen hereinafter, results in travel of the second shelf 66 which in turn results in the travel of the third shelf 68 and so on through the uppermost shelf 74 as seen best in FIG. 3.

Each of the shelves 28 is adapted to support a multilayered laminate stack 34 which may be equivalent to the typical multilayered circuit board 10 previously discussed in conjunction with FIG. 1. It will be understood that the height of each stack 34 has been greatly exaggerated in the figures for purposes of illustration. Each of the shelves 28 is also adapted to support a ring assembly 36 which will be discussed hereinafter in more detail in conjunction with FIGS. 6 and 7. For purposes of the present discussion, it is to be understood that each ring assembly 36 occupies the majority of space between the respective shelves 28 when the rod 24 of cylinder 22 is fully retracted and furthermore, that each such ring assembly occupies all of the space between the respective shelves 28 when the rod 24 is fully extended.

It will be seen hereafter that the ring assembly 36 of the present invention is designed to fully enclose a laminate stack 34 and when the rod 24 of cylinder 22 is fully extended, this enclosure becomes a gas-tight sealing enclosure. Such enclosures enable implementation of the laminating process by creating a localized chamber for each laminate stack 34 thereby permitting the application of heated, pressurized inert gas within each such chamber, the volume of which is sufficiently small to minimize the amount of such gas used in the laminating process. Thus, it is seen that each shelf 28 is adapted to travel vertically in order to provide means for selective compression of the entire stack of shelves upon extension of rod 24 of cylinder 22 to effect the seal of each chamber surrounding each laminate located on each such shelf. Furthermore, each shelf 28 is adapted for travel to also permit selective release of the respective seal chambers with retraction of rod 24 into cylinder 22 upon completion of the lamination process or upon initiation of the process prior to application of high pressure gas to each such chamber to facilitate access to each shelf for initiating and terminating the lamination process.

Figure 7:
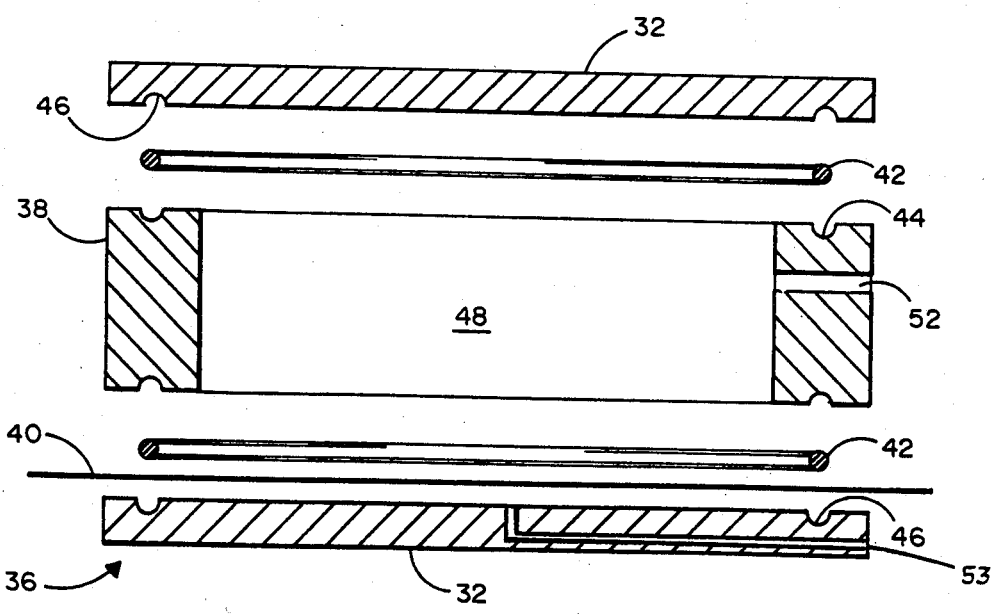
FIG. 7 is an enlarged cross sectional view of a ring assembly of the present invention taken along lines 7—7 of FIG. 6.
Figure 8:
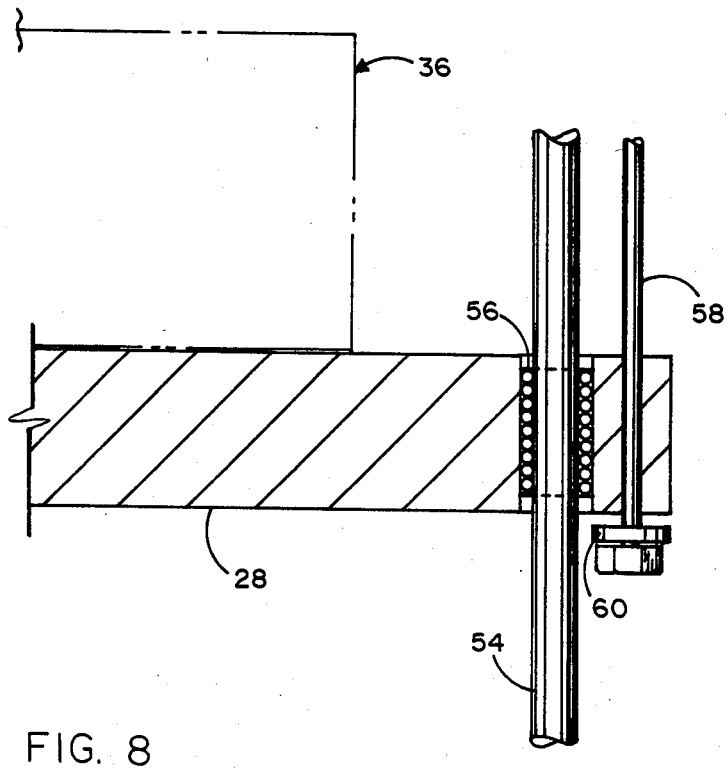
FIG. 8 is a rear view of a typical laminating shelf illustrating the manner in which each shelf is supported for vertical movement in the present invention.

Reference will now be made to FIGS. 7 and 8 for a more detailed description of the ring assembly 36 of the present invention. Ring assembly 36 comprises a circular hollow cylinder 38, a pair of sealing plates 32 and a pair of O-rings 42. As seen best in FIG. 7, the ring assembly 36 also comprises a silicon foil or skin 40 which is adapted to overlie the laminate stack within the ring assembly chamber and to substantially conform to the outer configuration of the stack in response to evacuation of the volume between the foil or skin and the stack as part of the lamination process performed by the present invention.

By comparing FIG. 7 with the previously discussed figures, it will be seen that each shelf is designed to support one of the seal plates 32 on its top surface. The seal plate in turn is designed to receive the laminate stack over which is placed the silicon foil or skin. The chamber which forms the volume into which high pressure, heated inert gas, such as carbon dioxide, is input, is formed principally by the hollow interior of circular cylinder 38 which is designed to radially enclose the laminate stack and to be supported along its periphery by a seal plate 36. A second seal plate 36, identical to the first, is then positioned on the opposite axial surface of circular cylinder 38 to fully enclose the chamber in which the laminate stack is subjected to the inert gas. As seen best in FIG. 7, the opposing axial surfaces of circular cylinder 38 and the matching interfacing surfaces of seal plates 36 are each provided with an annular recess identified in FIG. 7 as annular recess 44 in circular cylinder 38 and annular recess 46 in the respective seal plates. These annular recesses 44 and 46 are adapted to receive matching O-rings 42 which enable a gas-tight seal upon extension of rod 24 of cylinder 22 until a predetermined amount of pressure is applied to the O-ring elements. Typically, 100 pounds psi. of pressure applied to the O-rings by virtue of the extension of rod 22 is sufficient to provide a gas-tight seal to enable the lamination process to take place.

As seen further in FIG. 7, the ring assembly 36 of the present invention provides two ports comprising a vacuum outlet 53 and a gas inlet 52. Vacuum outlet 53 is designed to permit application of a suction means well-known in the art to create a suitable vacuum between a diaphragm such as silicon foil or skin 40 and the lower seal plate 36 for the purposes noted above. Similarly, gas inlet 52 is designed to provide a means for admitting heated inert gas such as carbon dioxide or nitrogen into chamber 48 for applying the requisite gas pressure to the laminate in accordance with the process defined by applicants' prior application.

Figure 9:
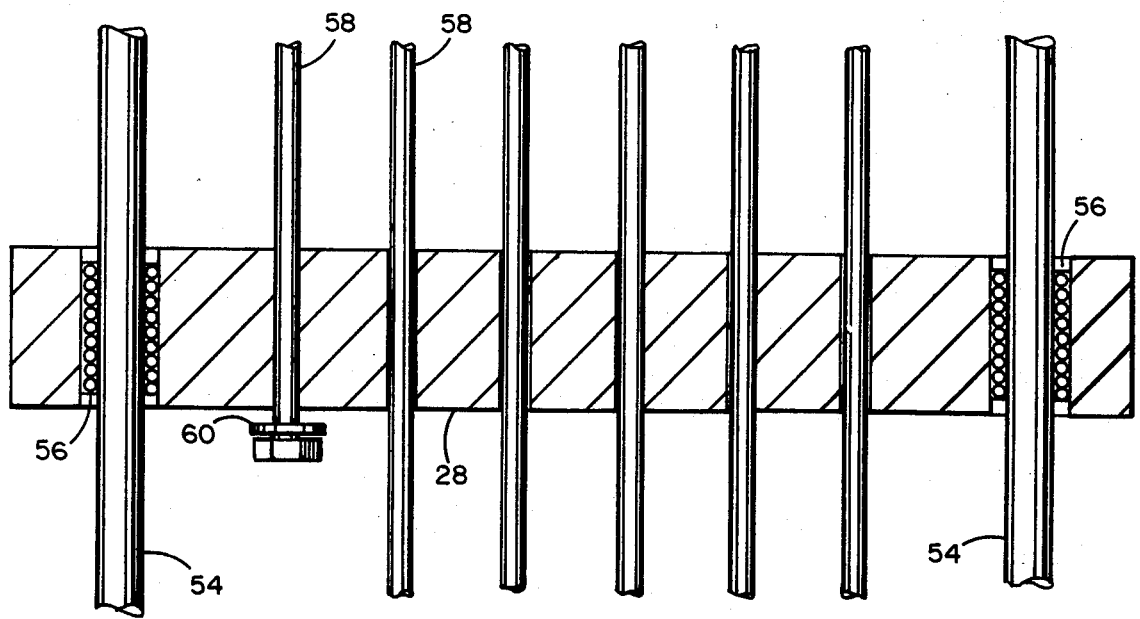
FIG. 9 is a cross sectional side view of a shelf taken along the lines 9—9 of FIG. 8.

The manner in which the shelves 28 of the present invention are suspended from and travel within housing 26 will now be described in conjunction with FIGS. 8 and 9. More specifically, referring to FIGS. 8 and 9 concurrently, it will be seen that each shelf 28 is suspended in a cantilevered configuration from a pair of elongated support tubes 54 by a corresponding pair of Thompson bearings 56. Thompson bearings are well-known in the mechanical arts and those having skill in the art to which the present invention pertains will understand that the Thompson bearings provide means for enabling each shelf 28 to travel along support tubes 54 while also providing for support of the bending moment due to the displacement between the center of gravity of the combined shelf and ring assembly and the axis of each support tube 54. It is of course, entirely possible to reduce or entirely remove such bending moments by locating support tubes 54 closer to or at points along shelf 28 through which a line would intersect the center of gravity of the shelf and ring assembly combination.

As previously indicated in the discussion pertaining to FIGS. 2-5, upon retraction of rod 24 of cylinder 22, the respective shelves 28 will come to rest at fixed positions designed to provide a degree of clearance between the bottom surface of each shelf and the top surface of the seal plate immediately beneath each shelf. In order to effect such predetermined stopping positions for the respective shelves 28, a plurality of stop rods 58 is provided, one such stop rod being provided for each shelf 28 with the exception of the lowermost shelf 64 which is affixed to the top of rod 24. Each such rod is suspended from the hood 29 and is of an appropriate length to correspond to the retracted rest position of the lower surface of the shelf. Thus, as seen in FIG. 9, which illustrates the lift assembly configuration for uppermost shelf 74, for the embodiment of the invention illustrated herein five such stop rods are provided. One such stop rod 58 is of appropriate length to terminate immediately below the bottom surface of uppermost shelf 74 and is provided with a stop cap 60 which is designed to receive the bottom surface of uppermost shelf 74 for assuring the appropriate rest position for that shelf upon retraction of rod 24. Four additional rods 58 are also shown in FIG. 9 and these extend to the respective bottom surfaces of the remaining four shelves 72, 70, 68 and 66, each of which depends upon a corresponding stop cap and stop rod for supporting the respective shelves in their rest position upon retraction of cylinder rod 24. Of course it will be understood that the lift assembly of the present invention comprising support tubes 54, Thompson bearing 56, stop rods 58 and stop caps 60, may be substantially modified or replaced by alternative means for carrying out the travel and stop positions for implementing the present invention.

It will now be understood that what has now been disclosed herein comprises a novel apparatus for laminating printed circuit boards having a plurality of layers including, typically, alternating circuit layers and dielectric layers. The apparatus of the present invention takes advantage of a novel process disclosed by the applicants of the present invention in a previously filed patent application which has been incorporated herein by reference. However, the present invention solves a noted disadvantage of applicants' prior invention by substantially reducing the volume of inert gas that must otherwise be used to effect the lamination process. More specifically, the present invention utilizes novel ring assemblies mounted on a vertical array of horizontally disposed moveable shelves to provide a plurality of localized gas-tight lamination chambers one such chamber being used for each laminate stack for concurrently laminating a plurality of multilayered printed circuit boards.

Each ring assembly of the invention comprises a hollow circular cylinder, the interior of which radially surrounds the laminate stack and the axial surfaces of which are covered by a pair of seal plates, each of which comprises an annular recess adapted to receive an O-ring. The O-ring is also received in a corresponding annular seal in the circular cylinder. Each such ring assembly is normally placed upon a shelf which is adapted to travel vertically along a pair of support tubes by means of a corresponding pair of Thompson bearings whereby the entire array of vertically aligned horizontally disposed shelves may be compressed relative to one another by a hydraulic or pneumatic cylinder. The rod of the cylinder is affixed to the lowermost shelf whereby extension of the rod simultaneously compresses the ring assemblies of all of the shelves of the invention thereby assuring a gas-tight seal within a localized chamber surrounding each laminate.

As a result of the disclosure of the present invention, it will now also be understood that the volume of inert gas that is needed to carry out the process of applicants' prior invention may be significantly reduced by means of the apparatus of the present invention because of the extreme reduction in the volume of the chamber within which each printed circuit board laminate is located.

The applicants herein have disclosed an illustrative embodiment of their invention in accordance with the best mode currently contemplated for carrying out the invention. However, those having skill in the art to which the present invention pertains will now, as a result of the teaching herein contained, appreciate that various modifications and additions may be made to the invention. However, all such modifications and additions are contemplated as being within the scope of the invention which is to be limited only by the claims appended hereto.

We claim:

1. An apparatus for laminating multilayered printed circuit boards, comprising:
   (a) a plurality of parallel shelves spaced from one another and adapted for relative travel whereby to selectively increase and decrease the distance therebetween,
   (b) a plurality of ring assemblies, one such assembly being positioned on each such shelf, each such assembly having means for entirely enclosing a printed circuit board to be laminated,
   (c) means for selectively changing the spacing between said shelves whereby to alternatively provide access to said ring assemblies for placing and removing a printed circuit board therein by increasing the distance between said shelves and provide a gas-tight seal of said ring assemblies for laminating said circuit board by decreasing the distance between said shelves until each ring assembly is in compression between said shelves.

2. The apparatus recited in claim 1 wherein said means for selectively changing the spacing between said shelves comprises a fluid-actuatable cylinder having a rod extendable therefrom, the free end of said rod being engageable with at least one of said shelves.

3. The apparatus recited in claim 1 wherein said ring assembly comprises:
   a hollow cylinder and a pair of sealing plates, said plates being adapted to mate with and cover the axial ends of said cylinder, and sealing means positioned between said plates and said axial ends for establishing a gas-tight seal therebetween in response to said compression of said ring assembly.

4. The apparatus recited in claim 3 wherein said sealing means comprises at least one O-ring and wherein said plates and said axial ends comprise matched opposing annular slots for receiving said O-ring.

5. The apparatus recited in claim 4 further comprising a flexible foil positioned between a sealing plate and adjacent O-ring for overlying and conforming to a printed circuit board within said ring assembly and for dividing the interior of said cylinder into two distinct gas-tight volumes.

6. The apparatus recited in claim 5 further comprising means within a wall of said cylinder for admitting inert gas into one of said gas-tight volumes of laminating said printed circuit board.

7. The apparatus recited in claim 6 further comprising means within said ring assembly for creating a substantial vacuum in the other one of said gas-tight volumes whereby to enable outgassing of said circuit board during laminating.

8. A laminating apparatus comprising:
   at least two parallel, spaced shelves adapted for selective relative movement therebetween,
   a ring assembly adapted for being located between said shelves and having a hollow cylinder and a pair of sealing plates, one of said plates being positioned at each axial end of said cylinder for providing a gas-tight chamber within said cylinder, and
   means for selectively compressing said shelves and ring assembly in a sandwich configuration for sealing said chamber.

9. The apparatus recited in claim 8 wherein said compressing means comprises a fluid-actuatable cylinder having a rod extendable therefrom, the free end of said rod being engageable with at least one of said shelves.

10. The apparatus recited in claim 8 further comprising sealing means positioned between said plates and said axial ends of said cylinder for establishing a gas-tight seal therebetween in response to said compressing of said shelves.

11. The apparatus recited in claim 10 wherein said sealing means comprises at least one O-ring and wherein said plates and said axial ends comprise matched opposing annular slots for receiving said O-ring.

12. The apparatus recited in claim 11 further comprising a flexible foil positioned between a sealing plate and adjacent O-ring for dividing the interior of said cylinder into two adjacent gas-tight volumes.

13. The apparatus recited in claim 12 further comprising means within a wall of said cylinder for admitting inert gas into one of said gas-tight volumes.

14. The apparatus recited in claim 13 further comprising means within said ring assembly for creating a substantial vacuum in the other one of said gas-tight volumes.

* * * * *